US010199487B1

(12) United States Patent
Elsayad et al.

(10) Patent No.: US 10,199,487 B1
(45) Date of Patent: Feb. 5, 2019

(54) MULTI-DRAIN GALLIUM-NITRIDE MODULE WITH MULTIPLE VOLTAGE RATINGS

(71) Applicants: Noureldeen Elsayad, Miami, FL (US); Mehdi Shojaie, Miami, FL (US); Osama Mohammed, Miami, FL (US)

(72) Inventors: Noureldeen Elsayad, Miami, FL (US); Mehdi Shojaie, Miami, FL (US); Osama Mohammed, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 15/979,807

(22) Filed: May 15, 2018

(51) Int. Cl.
| | |
|---|---|
| *H01L 29/778* | (2006.01) |
| *H01L 29/20* | (2006.01) |
| *H01L 23/31* | (2006.01) |
| *H01L 23/495* | (2006.01) |
| *H01L 23/535* | (2006.01) |
| *H02M 1/08* | (2006.01) |
| *H01L 29/866* | (2006.01) |
| *H01L 27/06* | (2006.01) |
| *H03K 17/687* | (2006.01) |
| *H02M 3/158* | (2006.01) |
| *H02M 7/5387* | (2007.01) |
| *H01L 29/94* | (2006.01) |

(52) U.S. Cl.
CPC ...... *H01L 29/7786* (2013.01); *H01L 23/3107* (2013.01); *H01L 23/49524* (2013.01); *H01L 23/535* (2013.01); *H01L 27/0629* (2013.01); *H01L 29/2003* (2013.01); *H01L 29/866* (2013.01); *H01L 29/94* (2013.01); *H02M 1/08* (2013.01); *H02M 3/158* (2013.01); *H02M 7/5387* (2013.01); *H03K 17/6871* (2013.01)

(58) Field of Classification Search
CPC ............ H01L 29/7786; H01L 29/2003; H01L 29/866; H01L 29/94; H01L 23/3107; H01L 23/49524; H01L 23/535; H03K 17/6871
USPC .... 327/108–112, 427, 434, 437; 326/82, 83, 326/87
See application file for complete search history.

(56) References Cited

U.S. PATENT DOCUMENTS

| | | | | |
|---|---|---|---|---|
| 2008/0247204 | A1* | 10/2008 | Renken | B60L 11/1803 363/124 |
| 2011/0101466 | A1* | 5/2011 | Wu | H01L 23/057 257/392 |
| 2014/0184140 | A1* | 7/2014 | Lee | H02J 7/0054 320/103 |
| 2015/0249447 | A1* | 9/2015 | Wu | H01L 21/28264 327/109 |

* cited by examiner

*Primary Examiner* — Thomas Skibinski
(74) *Attorney, Agent, or Firm* — Saliwanchik, Lloyd & Eisenschenk

(57) ABSTRACT

A multi-drain power module can include: a plurality of gallium-nitride (GaN) transistor dies connected to each other in series; a plurality of drain terminals, each drain terminal being respectively connected to the drain of a GaN transistor die; a series-switch-driver (SSD) connected to the gate of each GaN transistor die; a gate terminal connected to the SSD; a source terminal connected to a first source of a first GaN transistor die of the plurality of GaN transistor dies; a package encapsulating the plurality of GaN transistor dies and the SSD, and exposing the plurality of drain terminals, the gate terminal, and the source terminal.

20 Claims, 9 Drawing Sheets

MULTI-DRAIN GALLIUM-NITRIDE MODULE WITH MULTIPLE VOLTAGE RATINGS

BACKGROUND

There is a high demand in medium-voltage power systems for efficient high-voltage power transistors. A power switching module built with gallium nitride (GaN) High Electron Mobility Transistors (HEMTs) can reduce the conduction and switching losses of transistors because GaN HEMTs have lower on resistance (Ron) and less device total charge. The major problem with GaN HEMTs is that their breakdown voltage is relatively low compared to Si and SiC MOSFETs or IGBTs, which limits the utilization of GaN HEMTs in low-voltage applications. That is, there are currently no efficient and compact GaN transistors available with a high voltage rating.

BRIEF SUMMARY

Embodiments of the subject invention provide novel and advantageous multi-drain power modules that comprise a plurality of drain terminals, each of the plurality of drain terminals being connected to a drain of a GaN transistor die and exposed outside a package encapsulating a plurality of such GaN transistor dies, thereby providing multiple voltage ratings.

In an embodiment, a multi-drain power module can comprise: a plurality of gallium-nitride (GaN) transistor dies, the GaN transistor dies being connected to each other in series; a plurality of drain terminals, each drain terminal of the plurality of drain terminals being connected to a respective drain of a GaN transistor die of the plurality of GaN transistor dies; a series-switch-driver (SSD) connected to respective gates of multiple GaN transistor dies of the plurality of GaN transistor dies; a gate terminal connected to the SSD; a source terminal connected to a first source of a first GaN transistor die of the plurality of GaN transistor dies; and a package encapsulating the plurality of GaN transistor dies and the SSD, and exposing (i.e., leaving uncovered by the package and not encapsulated by the package) the plurality of drain terminals, the gate terminal, and the source terminal. In a further embodiment, the SSD can be connected to respective gates of all GaN transistor dies of the plurality of GaN transistor dies. In a further embodiment, the drain of all GaN transistor dies of the plurality of GaN transistor dies can be respectively connected to a drain terminal of the plurality of drain terminals.

In another embodiment, a multi-drain power module can comprise: a first gallium-nitride (GaN) transistor die including a first source, a first gate, and a first drain; a second GaN transistor die including a second source, a second gate, and a second drain, the second source being connected to the first drain; a first Ferrite Bead (FB) connected between a first gate intermediate terminal and the first gate; a first driver connected between a first gate input terminal and the first gate intermediate terminal; a second FB connected between a second gate intermediate terminal and the second gate; a second driver connected between a second gate input terminal and the second gate intermediate terminal; a gate terminal connected to the first gate input terminal; a source terminal connected to the first source; a first drain terminal connected to the first drain; a second drain terminal connected to the second drain; and a package encapsulating the first and second GaN transistor dies, and exposing the first and second drain terminals, the gate terminal, and the source terminal.

In yet another embodiment, a multi-drain power module can comprise: a plurality of gallium-nitride (GaN) transistor dies including a first GaN transistor die and a second GaN transistor die (all the way to an ith GaN transistor die), the first GaN transistor die including a first source, a first gate, and a first drain, the second GaN transistor die including a second source, a second gate, and a second drain, and the ith GaN transistor die including an ith source, an ith gate, and an ith drain, i being from 3 to N; a first FB connected between a first gate intermediate terminal and the first gate; a first driver connected between a first gate input terminal and the first gate intermediate terminal; a second FB connected between a second gate intermediate terminal and the second gate; a second driver connected between a second gate input terminal and the second gate intermediate terminal; an ith FB connected between a ith gate intermediate terminal and the ith gate; an ith driver connected between an ith gate input terminal and the ith gate intermediate terminal; a gate terminal connected to the first gate input terminal; a source terminal connected to the first source; a first drain terminal connected to the first drain; a second drain terminal connected to the second drain; an ith drain terminal connected to the ith drain; a first gate capacitor connected between the first gate input terminal and the second gate input terminal; an (i−1)th gate capacitor connected between the ith gate intermediate terminal and the (i−1)th source; an Nth gate capacitor connected between the Nth gate intermediate terminal and the Nth drain; and a package encapsulating the plurality of GaN transistor dies, and exposing the first and second to Nth drain terminals, the gate terminal, and the source terminal.

DETAILED DESCRIPTION

Embodiments of the subject invention provide novel and advantageous multi-drain power modules that comprise a plurality of drain terminals, each of the plurality of drain terminals being connected to a drain of a gallium nitride (GaN) transistor die of a plurality of GaN transistor dies and exposed outside a package encapsulating the plurality of GaN transistor dies, thereby providing multiple voltage ratings.

Embodiments of the subject invention provide multi-drain GaN (MD-GaN) power modules with multiple voltage ratings. The MD-GaN power modules of embodiments of the subject invention allow the power electronics designer to select one of the drains in order to have the least on-resistance (Ron) of the power module and thus minimize the conduction losses of the power module. The MD-GaN power module comprises multiple GaN transistor dies, where the "transistor die" is the semiconductor part that performs the function of the transistor without a package (i.e., the transistor die excludes a package). The multiple GaN transistor dies are connected in series to each other and connected to a series-switch-driver (SSD) circuit.

This MD-GaN power module can have multiple drain terminals, and each of them can be associated with one of the GaN transistor dies. For example, when a two-die MD-GaN module is presented, two GaN transistor dies are connected in series and an SSD circuit is embedded inside the module package to manage the operation of the two GaN transistor dies. For this two-die MD-GaN power module, there are two drain terminals (e.g., D1 and D2) that are exposed outside the module package. Therefore, the power electronics designer can select either to use D1 or D2 (if D1 is chosen, the module will be rated at the rated voltage of one GaN transistor die, and will have the on-resistance (Ron) of one GaN transistor die, while if D2 is chosen, the module will be rated at double the rated voltage of one GaN transistor die, and will have double the Ron of one GaN transistor die). That is, the designer can either configure the module to have lower rated voltage and lower Ron (=lower conduction loss) or have higher rated voltage and higher Ron (=higher conduction loss) by using the two-die MD-GaN power module.

Figure 1A:
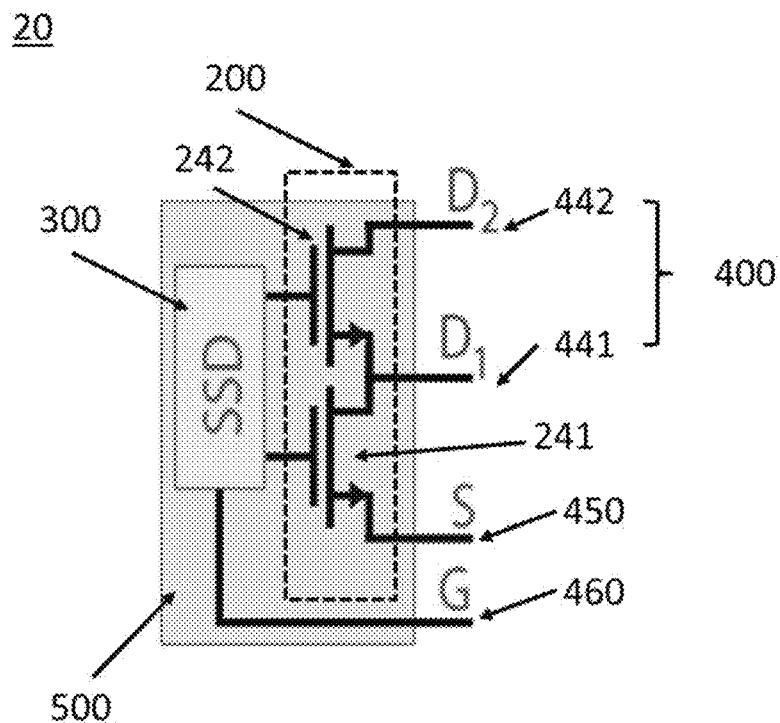
FIG. 1(a) shows a circuit of a two-die multi-drain gallium nitride (MD-GaN) power module according to an embodiment of the subject invention.
Figure 1B:
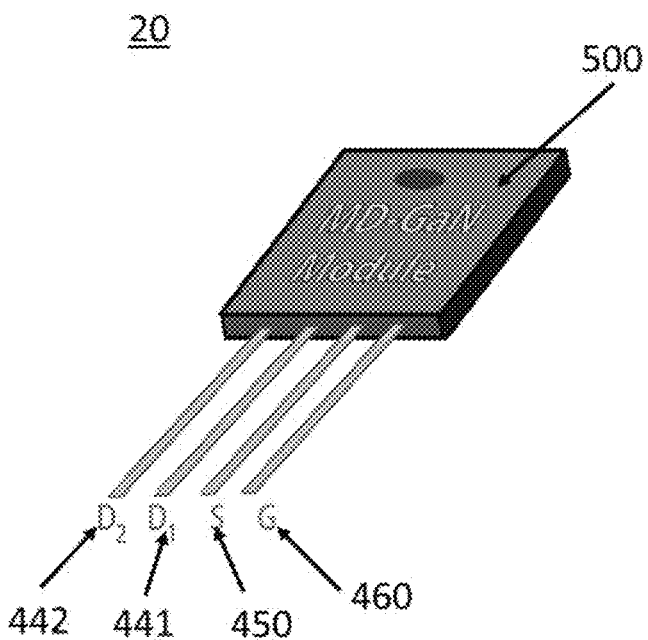
FIG. 1(b) shows a module package of a two-die MD-GaN power module according to an embodiment of the subject invention.

FIGS. 1(a) and (b) show a circuit and a module package of a two-die multi-drain gallium nitride (MD-GaN) power module according to an embodiment of the subject invention, respectively. Referring to FIGS. 1(a) and 1(b), a two-die MD-GaN power module 20 comprises a plurality of GaN transistor dies 200, a series-switch-driver (SSD) 300, and a plurality of drain terminals 400.

The plurality of GaN transistor dies 200 comprises a first GaN transistor die 241 and a second GaN transistor die 242 that are connected to each in series. The SSD 300 is connected to each gate of the first GaN transistor die 241 and the second GaN transistor die 242 in order to provide gate control signal to the each gate. The plurality of drain terminals 400 comprises a first drain terminal D1 441 and a second drain terminal D2 442 that are configured to be connected to drains of the first GaN transistor die 241 and the second GaN transistor die 242, respectively. In addition, a source terminal S 450 is connected to a source of the first GaN transistor die 241, and a gate terminal G 460 is connected to the SSD 300.

A package 500 encapsulates the GaN transistor dies 200 and the SSD 300 to protect the elements and exposes the first drain terminal D1 441, the second drain terminal D2 442, the source terminal S 450, and the gate terminal G 460 such that the exposed first drain terminal D1 441 and the exposed second drain terminal D2 442 can be connected to other elements outside the package 500. That is, the two-die MD-GaN power module 20 can provide a first rated voltage at the first drain terminal D1 441 and a second rated voltage at the second drain terminal D2 442, and the power electronics designer can use any one rated voltage based on the required condition.

Figure 6:
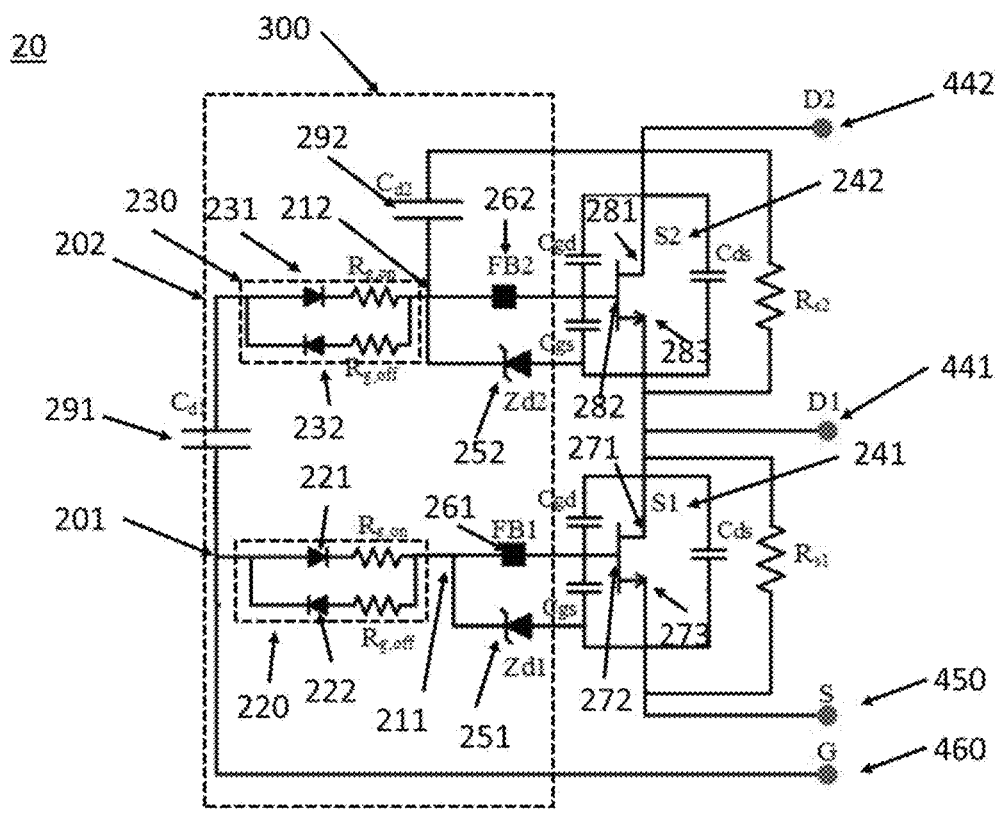
FIG. 6 shows two GaN transistor dies and a series-switch-driver (SSD) of a two-die MD-GaN power module according to an embodiment of the subject invention.

FIG. 6 shows two GaN transistor dies and a series-switch-driver (SSD) of a two-die MD-GaN power module according to an embodiment of the subject invention. Referring to FIGS. 1(a), 1(b), and 6, the two-die MD-GaN power module 20 comprises the first GaN transistor die 241 including a first drain 271, a first gate 272, and a first source 273, and a second GaN transistor die 242 including a second drain 281, a second gate 282, and a second source 283. The first drain 271 of the first GaN transistor die 241 is connected to the second source 283 of the second GaN transistor die 251.

The SSD 300 comprises a first driver 220 connected between a first gate input terminal 201 and a first gate intermediate terminal 211, and a second driver 230 connected between a second gate input terminal 202 and a second gate intermediate terminal 212. The first gate intermediate terminal 211 is coupled to the first gate 272, and the second gate intermediate terminal 212 is coupled to the second gate 282.

The SSD 300 further comprises a first gate capacitor 291 connected between the first gate input terminal 201 and the second gate input terminal 202, and a second gate capacitor 292 connected between the second gate intermediate terminal 212 and the second drain 281 of the second GaN transistor die 242. In addition, the SSD 300 comprises a first Zener diode 251 connected between the first gate intermediate terminal 211 and the first source 273 of the first GaN transistor die 241, and a second Zener diose 252 connected between the second gate intermediate terminal 212 and the second source 283 of the second GaN transistor die 242.

The SSD 300 comprises a first FB 261 connected between the first gate intermediate terminal 211 and the first gate 272 of the first GaN transistor die 241, and a second FB 262 connected between the second gate intermediate terminal 212 and the second gate 282 of the second GaN transistor die 242. Each of the first FB 261 and the second FB 262 is a component with passive elements such as a resistor (R), an inductor (L), and a capacitor (C) that filters high-frequency oscillations in the gate-source voltage of the transistors during the switching transitions.

The first driver 220 comprises a first driver first diode 221 and a first driver second diode 222. The first driver first diode 221 with an on resistor $R_{g,on}$ is connected between the first gate input terminal 201 and the first gate intermediate terminal 211 such that a diode forward current flows from the first gate input terminal 201 to the first gate intermediate terminal 211. The first driver second diode 222 with an off resistor $R_{g,off}$ is connected between the first gate input terminal 201 and the first gate intermediate terminal 211 such that a diode forward current flows from the first gate intermediate terminal 211 to the first gate input terminal 201.

Similar to the first driver 220, the second driver 230 comprises a second driver first diode 231 and a second driver second diode 232. The second driver first diode 231 with the on resistor $R_{g,on}$ is connected between the second gate input terminal 202 and the second gate intermediate terminal 212 such that a diode forward current flows from the second gate input terminal 202 to the second gate intermediate terminal 212. The first driver second diode 222 with the off resistor $R_{g,off}$ the is connected between the second gate input terminal 202 and the second gate intermediate terminal 212 such that a diode forward current flows from the second gate intermediate terminal 212 to the second gate input terminal 202.

Each of the first GaN transistor die 241 and the second GaN transistor die 242 has parasitic capacitances including a drain-source parasitic capacitance $C_{ds}$, a gate-source parasitic capacitance $C_{gs}$, and a gate-drain parasitic capacitance $C_{gd}$. In addition, the first GaN transistor die 241 and the second GaN transistor die 242 have a first resistance $R_{s1}$ and a second resistance $R_{s2}$, respectively.

The source terminal S 450 is connected to the first source 273, the first drain terminal D1 441 is connected to the first drain 271, and the second drain terminal D2 442 is connected to the second drain 281. In addition, the gate terminal G 460 is connected to the first gate input terminal 201 and coupled to the second gate input terminal 202 through the first gate capacitor 291.

Figure 2A:
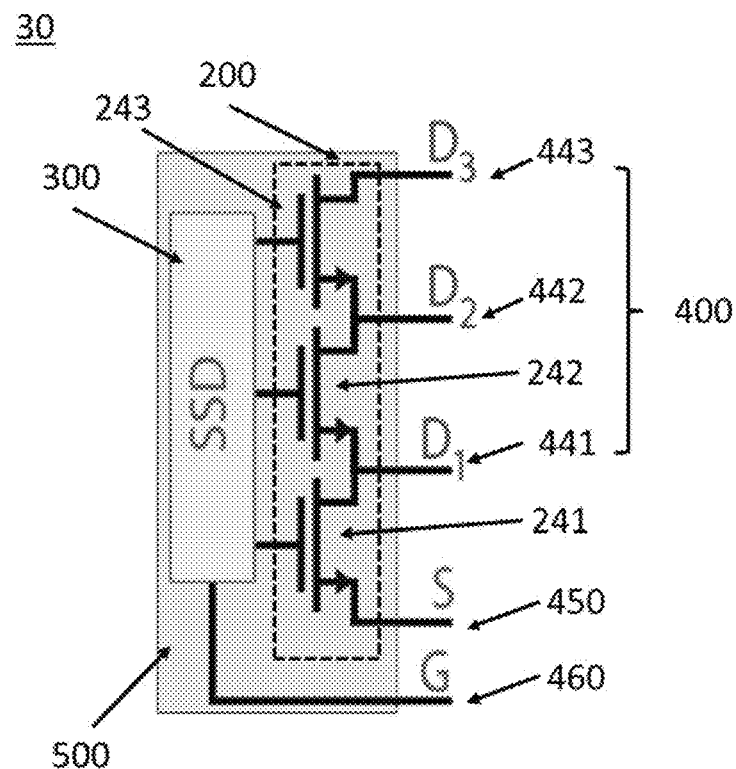
FIG. 2(a) shows a circuit of a three-die MD-GaN power module according to an embodiment of the subject invention.
Figure 2B:
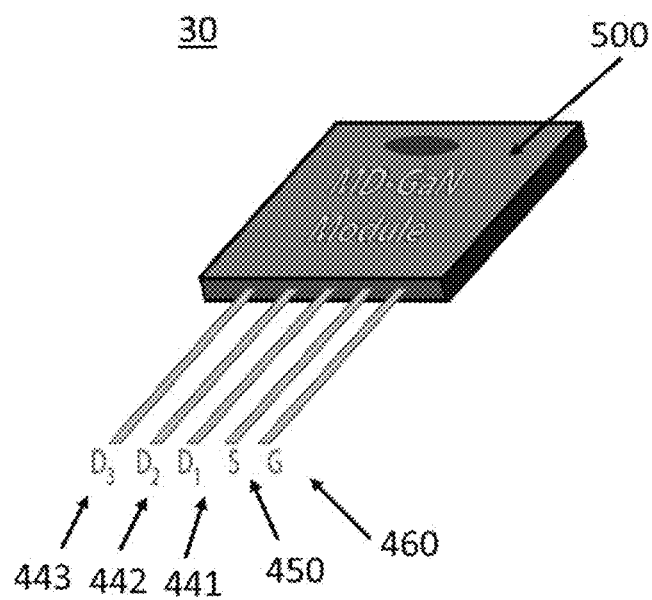
FIG. 2(b) shows a module package of a three-die MD-GaN power module according to an embodiment of the subject invention.

FIGS. 2(a) and 2(b) show a circuit and module package of a three-die MD-GaN power module according to an embodiment of the subject invention, respectively. Similar to the two-die MD-GaN power module 20 of FIGS. 1(a) and 1(b), a three-die MD-GaN power module 30 comprises the plurality of GaN transistor dies 200, the SSD 300, and the plurality of drain terminals 400. Referring to FIGS. 2(a) and 2(b), the plurality of GaN transistor dies 200 comprises the first GaN transistor die 241, the second GaN transistor die 242, and a third GaN transistor die 243 that are connected to each in series. The SSD 300 is connected to each gate of the first GaN transistor die 241 to the third GaN transistor die 243 in order to provide gate control signal to the each gate. The plurality of drain terminals 400 comprises the first drain terminal D1 441, the second drain terminal D2 442, and a third drain terminal D3 443 that are configured to be connected to drains of the first GaN transistor die 241, the second GaN transistor die 242, and the third GaN transistor die 243, respectively. In addition, the source terminal S 450 is connected to a source of the first GaN transistor die 241, and the gate terminal G 460 is connected to the SSD 300.

The package 500 encapsulates the GaN transistor dies 200 and the SSD 300 to protect the elements and exposes the first drain terminal D1 441, the second drain terminal D2 442, the third drain terminal D3 443, the source terminal S 450, and the gate terminal G 460 such that the exposed first drain terminal D1 441, the exposed second drain terminal D2 442, and the exposed third drain terminal 443 can provide a first rated voltage at the first drain terminal D1 441, a second rated voltage at the second drain terminal D2 442, and a third rated voltage at the third drain terminal D3 443.

Figure 3A:
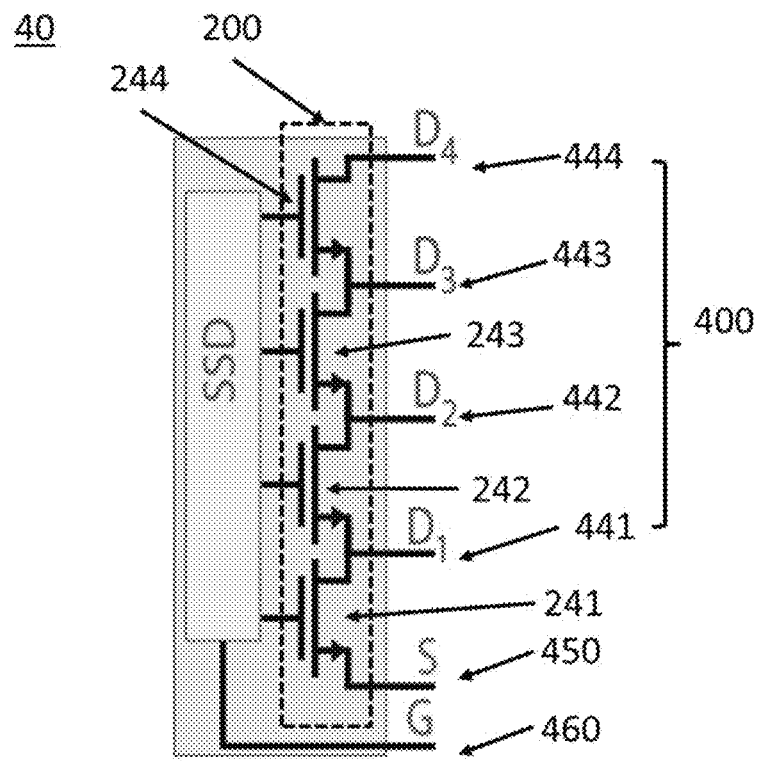
FIG. 3(a) shows a circuit of a four-die MD-GaN power module according to an embodiment of the subject invention.
Figure 3B:
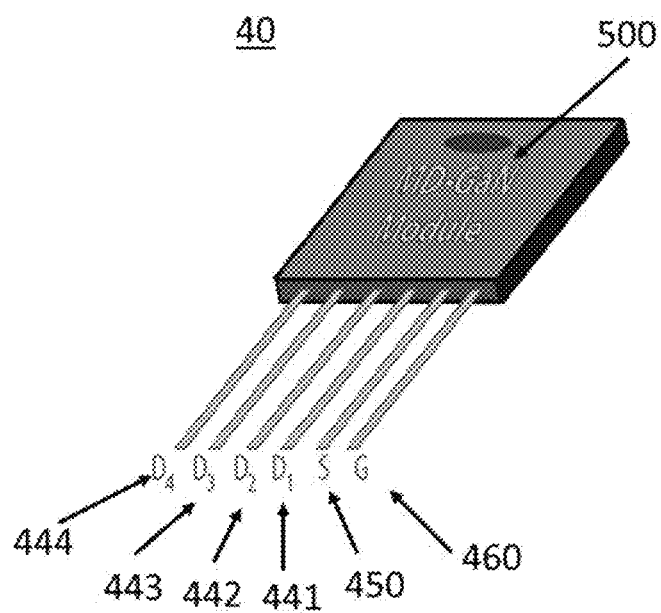
FIG. 3(b) shows a module package of a four-die MD-GaN power module according to an embodiment of the subject invention.
Figure 4:
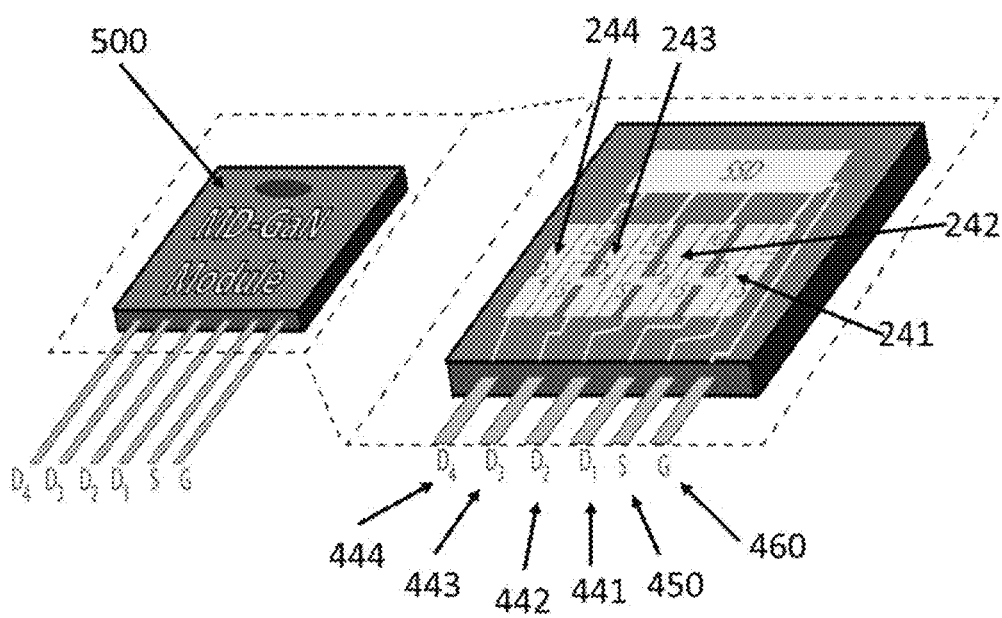
FIG. 4 shows an internal structure of a four-die MD-GaN power module according to an embodiment of the subject invention.

FIGS. 3(a) and 3(b) show a circuit of a four-die MD-GaN power module according to an embodiment of the subject invention, respectively. FIG. 4 shows an internal structure of a four-die MD-GaN power module according to an embodiment of the subject invention. Referring to FIGS. 3(a), 3(b), and 4, a four-die MD-GaN power module 40 comprises a fourth GaN transistor die 244 connected to the third GaN transistor die 243, and a fourth drain terminal 444 connected to a drain of the fourth GaN transistor die 244.

Figure 5A:
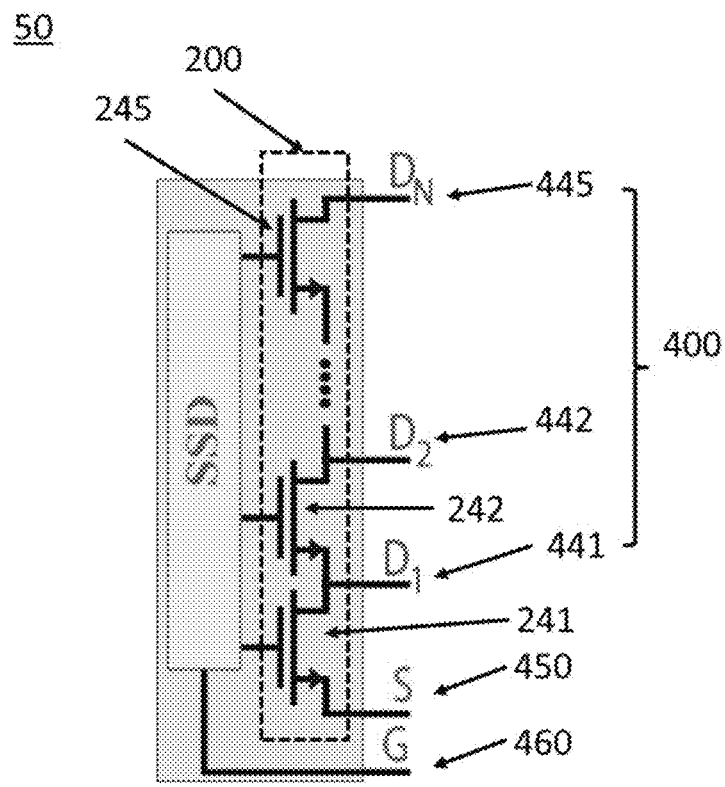
FIG. 5(a) shows a circuit of an N-die MD-GaN power module according to an embodiment of the subject invention.
Figure 5B:
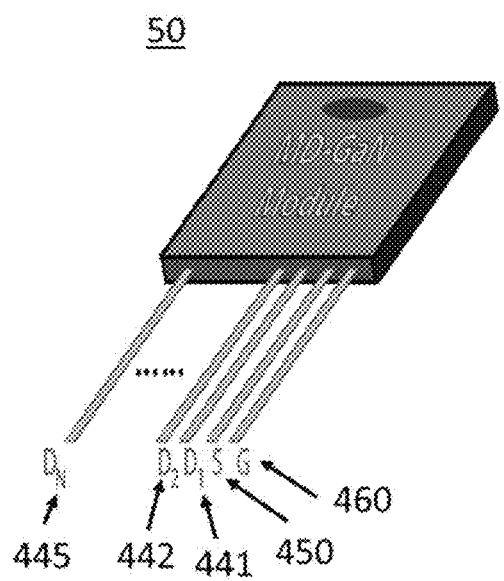
FIG. 5(b) shows a module package of an N-die MD-GaN power module according to an embodiment of the subject invention.

FIGS. 5(a) and 5(b) show a circuit of an N-die MD-GaN power module according to an embodiment of the subject invention, respectively. Referring to FIGS. 5(a) and 5(b), a N-die MD-GaN power module 50 comprises the first GaN transistor die 241 to an Nth GaN transistor die 245 and the first drain terminal 441 to an Nth drain terminal 445. The Nth drain terminal 445 is connected to a drain of the Nth GaN transistor die 245. In this context, N is an integer and can be any reasonable number (e.g., N can be in a range of from 3 to 1,000,000 or more, or can be any value or range contained therein).

Figure 7:
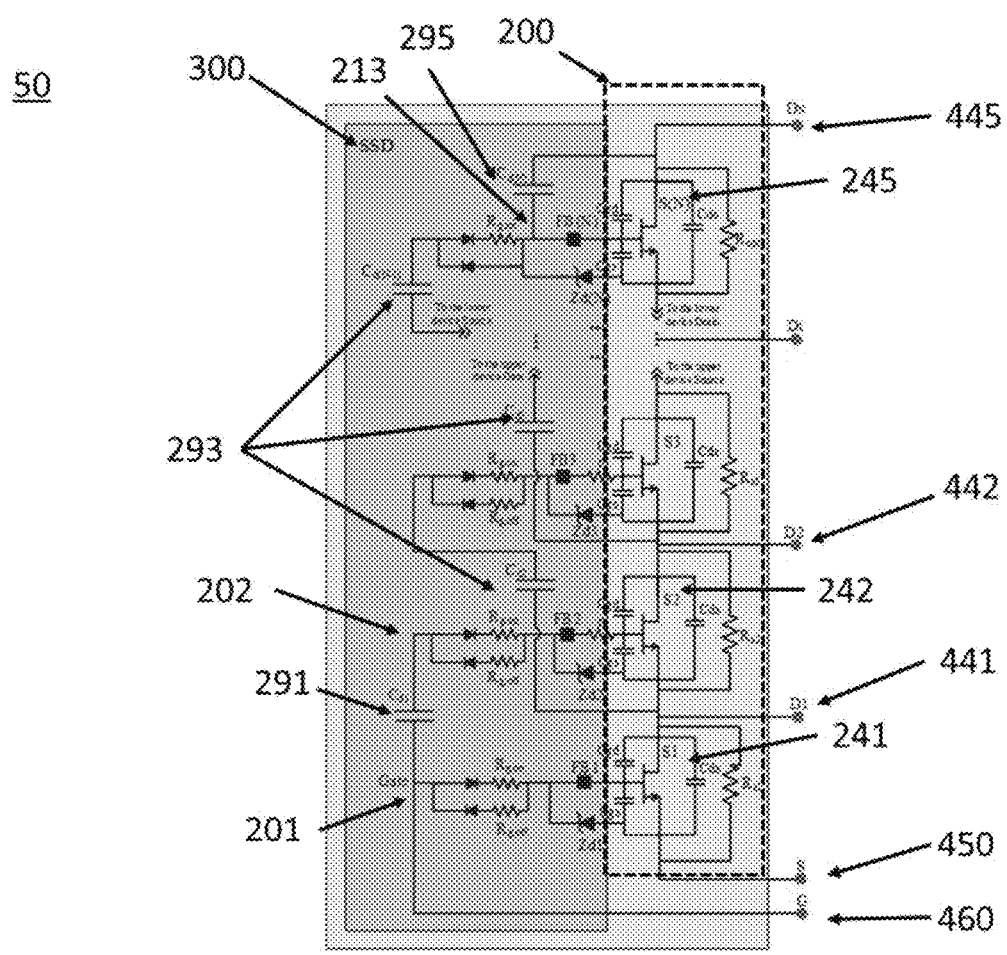
FIG. 7 shows N GaN transistor dies and a series-switch-driver (SSD) of an N-die MD-GaN power module according to an embodiment of the subject invention.

FIG. 7 shows N GaN transistor dies and a series-switch-driver (SSD) of an N-die MD-GaN power module according to an embodiment of the subject invention. Referring to FIGS. 5(a), 5(b), 6, and 7, the N-die MD-GaN power module 50 comprises the first GaN transistor die 241 to Nth GaN transistor die 245 (i.e., S1, S2, S3, . . . , S(N)) connected to each other in series, and the first drain terminal D1 441 to Nth drain terminal $D_N$ 445 that are connected to each drain of the plurality of GaN transistor dies 200. That is, a first drain of the first GaN transistor die 241 is connected to a second source of the second GaN transistor die 242, the first drain terminal D1 441 is connected to the first drain of the first GaN transistor die 241, an ith drain of ith GaN transistor die is connected to a (i+1)th source of a (i+1)th GaN transistor die, an ith drain terminal D1 is connected to the ith drain of the ith GaN transistor die, and an Nth drain of the Nth GaN transistor die 245 is connected to the Nth drain terminal $D_N$ 445, and i can be in a range of 2 to (N−1).

The SSD 300 of the N-die MD-GaN power module 50 comprises the first gate capacitor 291 connected between the first gate input terminal 201 and the second gate input terminal 202, an ith gate capacitor 293 connected between a (i+1)th gate input terminal and an ith source of the ith GaN transistor die, and an Nth gate capacitor 295 connected between an Nth gate intermediate terminal 213 and the Nth drain of the Nth GaN transistor die 245.

As discussed above, a multi-drain power module can be one of the two-die MD-GaN power module 20 including two drain terminals, the three-die MD-GaN power module 30 including three drain terminals, the four-die MD-GaN power module 40 including four drain terminals, or the N-die MD-GaN power module 50 including N drain terminals.

Figure 8A:
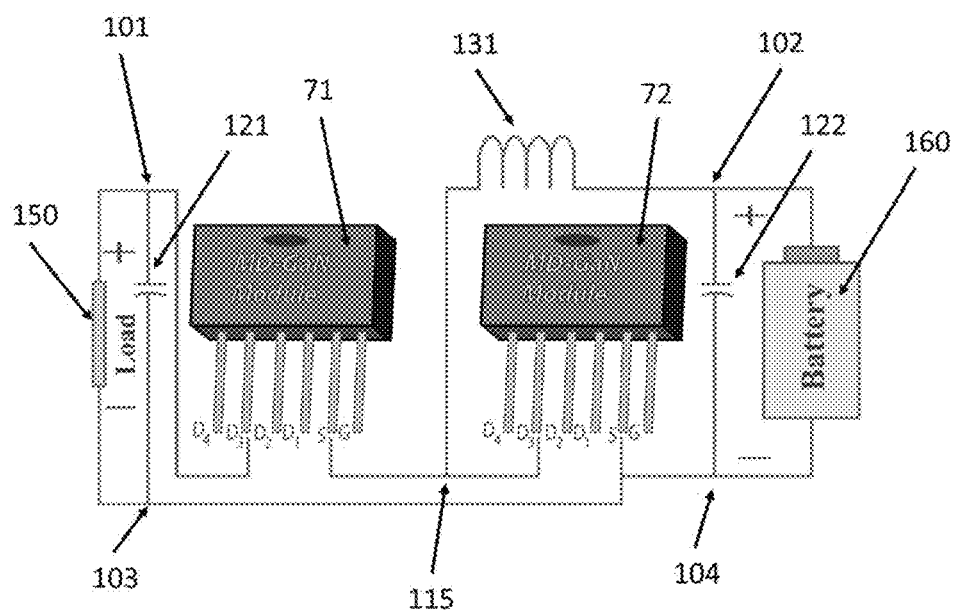
FIG. 8(a) shows a connection diagram of a bi-directional boost DC-DC converter according to an embodiment of the subject invention.
Figure 8B:
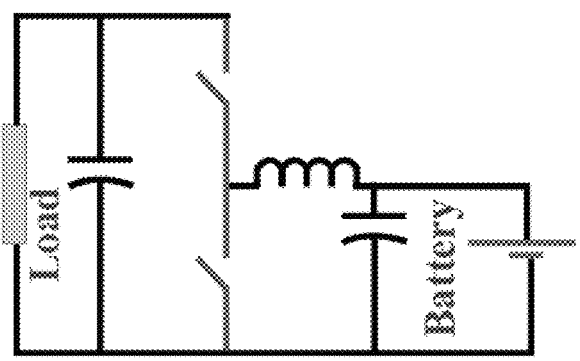
FIG. 8(b) shows a circuit of a bi-directional boost DC-DC converter according to an embodiment of the subject invention.

FIGS. 8(a) and 8(b) show a connection diagram and a circuit of a bi-directional boost DC-DC converter according to an embodiment of the subject invention, respectively. Referring to FIGS. 8(a) and 8(b), a bi-directional boost DC-DC converter 60 comprises a first multi-drain power module 71 and a second multi-drain power module 72. Each of the first multi-drain power module 71 and the second multi-drain power module 72 is one of the of the two-die MD-GaN power module 20 including two drain terminals, the three-die MD-GaN power module 30 including three drain terminals, the four-die MD-GaN power module 40 including four drain terminals, or the N-die MD-GaN power module 50 including N drain terminals.

The bi-directional boost DC-DC converter 60 comprises a first terminal 101 connected to one of the plurality of drain terminals D1 to D4 of the first multi-drain power module 71, a first intermediate terminal 115 connected to a source terminal S of the first multi-drain power module 71 and one of the plurality of drain terminals D1 to D4 of the second multi-drain power module 72, and a first inductor 131 connected between the first intermediate terminal 115 and a second terminal 102. In addition, the bi-directional boost DC-DC converter 60 further comprises a first capacitor 121 connected between the first terminal 101 and a third terminal 103, and a second capacitor 122 connected between the second terminal 102 and a fourth terminal 104. The third terminal 103 and the fourth terminal 104 are connected to a source terminal S of the second multi-drain power module 72.

A battery 160 can be connected between the second terminal 102 and the fourth terminal 104 while being parallel to the second capacitor 122, and a load 150 can be connected between the first terminal 101 and the third terminal 103 while being parallel to the first capacitor 121.

Figure 9A:
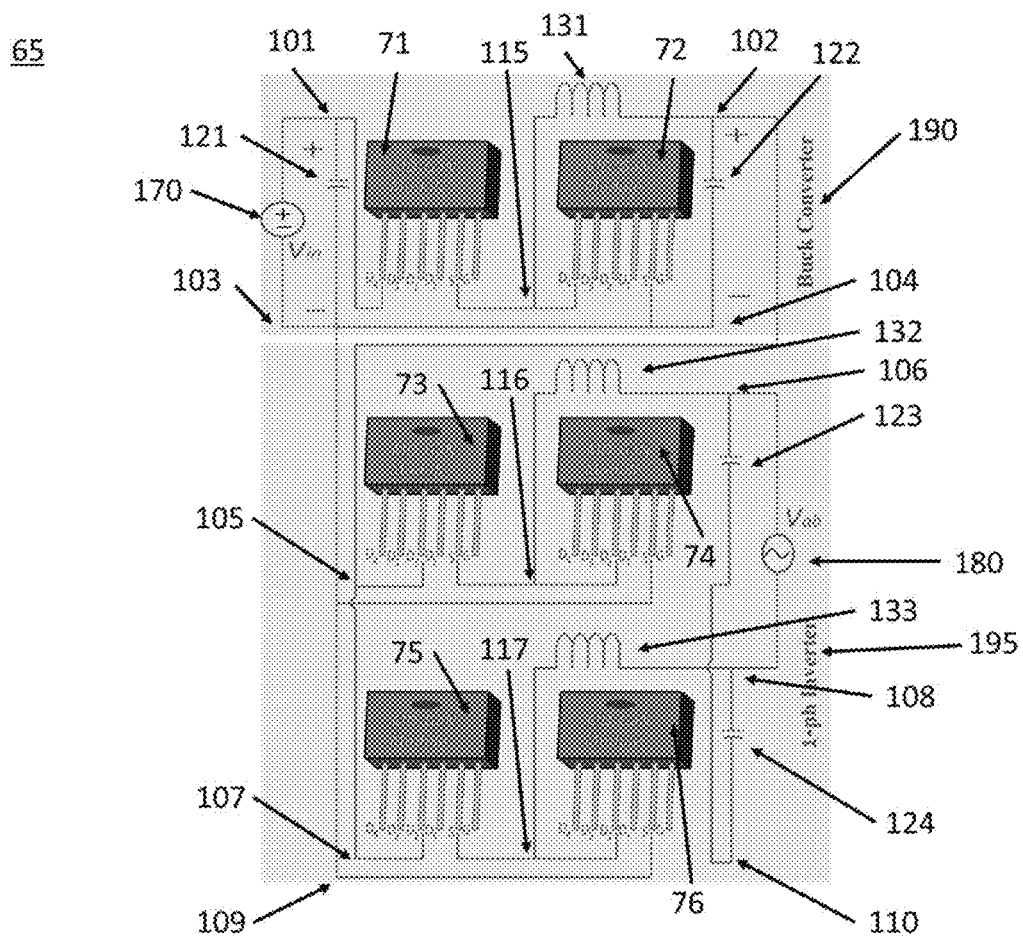
FIG. 9(a) shows a connection diagram of a single-phase VSI assisted with buck converter according to an embodiment of the subject invention.
Figure 9B:
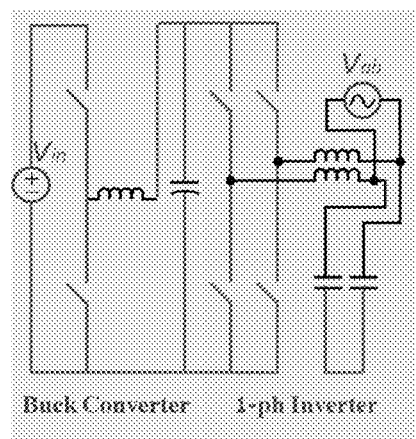
FIG. 9(b) shows a circuit of a single-phase voltage source inverter (VSI) assisted with buck converter according to an embodiment of the subject invention.

FIGS. 9(a) and 9(b) show a connection diagram and a circuit, respectively, of a single-phase voltage source inverter (VSI) assisted with buck converter according to an embodiment of the subject invention. Referring to FIGS. 9(a) and 9(b), a single-phase VSI 65 comprises the first multi-drain power module 71, the second multi-drain power module 72, a third multi-drain power module 73, a fourth multi-drain power module 74, a fifth multi-drain power module 75, and a sixth multi-drain power module 76. Each of the first multi-drain power module 71 to the six multi-drain power module 76 is one of the of the two-die MD-GaN power module 20, the three-die MD-GaN power module 30, the four-die MD-GaN power module 40, or the N-die MD-GaN power module 50.

The single-phase VSI 65 comprises a buck converter 190 including the first multi-drain power module 71 and the second multi-drain power module 72, and a single phase inverter 195 including the third multi-drain power module 73 to the sixth multi-drain power module 76.

The buck converter 190 of the single-phase VIS 65 comprises a first terminal 101 connected to one of the plurality of drain terminals D1-D4 of the first multi-drain power module 71; a first intermediate terminal 115 connected to a source terminal S of the first multi-drain power module 71 and one of the plurality of drain terminals D1-D4 of the second multi-drain power module 72; a first inductor 131 connected between the first intermediate terminal 115 and a second terminal 102; a first power source 170 connected between the first terminal 101 and a third terminal 103; and a fourth terminal 104 connected to a source terminal S of the second multi-drain power module 72 and the third terminal 103.

The single phase inverter 195 of the single-phase VIS 65 comprises a fifth terminal 105 connected to the second terminal 102 and one of the plurality of drain terminals D1-D4 of the third multi-drain power module 73; a second intermediate terminal 116 connected to a source terminal S of the third multi-drain power module 73 and one of the plurality of drain terminals D1-D4 of the fourth multi-drain power module 74; and a second inductor 132 connected between the second intermediate terminal 116 and a sixth terminal 106. In addition, the single phase inverter 195 further comprises a seventh terminal 107 connected to the second terminal 102 and one of the plurality of drain terminals D1-D4 of the fifth multi-drain power module 75; a third intermediate terminal 117 connected to a source terminal S of the fifth multi-drain power module 75 and one of the plurality of drain terminals D1-D4 of the sixth multi-drain power module 76; a third inductor 133 connected between the third intermediate terminal 117 and an eighth terminal 108; and a second power source 180 connected between the sixth terminal 106 and the eighth terminal 108.

The single-phase VSI 65 comprises a first capacitor connected 121 between the first terminal 101 and a ninth terminal 109; a second capacitor 122 connected between the second terminal 102 and the fourth terminal 104; a third capacitor 123 connected between the sixth terminal 106 and a tenth terminal 110; and a fourth capacitor 124 connected between the eighth terminal 108 and the tenth terminal 110. The ninth terminal 109 is connected to a source terminal S of the fourth multi-drain power module 74 and a source terminal S of the sixth multi-drain power module 76.

Embodiments of the subject invention provide high voltage transistor modules with multiple drains for multiple voltage ratings, and embodiments can be used in DC-DC, AC-DC, and DC-AC power electronics systems, transportation electrification like electric vehicle, aircraft, ship, etc.

Device of embodiments of the subject invention include general transistors to be used for different voltage ratings with optimum efficiency, thereby minimizing power losses, and requiring just one gate driver supply that is the same for all voltage ratings.

The multi-drain GaN transistors of embodiments of the subject invention have all of the advantages of GaN transistors combined with high-voltage capability. They can be also optimized for applications with lower voltage rating. Thus, the multi-drain transistors are general optimized transistors for a range of voltages.

The developed general multi-drain transistors of embodiments of the subject invention can be used for different voltage levels, so the production cost will be reduced. These transistors have lower power losses compared to related art devices, so they are more energy conservative. In addition, due to low loss and high thermal conductivity, reduced cooling systems will be required. Therefore, embodiments of the subject invention can be applied to smart power grids, solar and wind resources integration, electric vehicles, and aerospace power systems.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A multi-drain power module, comprising: a plurality of gallium-nitride (GaN) transistor dies connected to each other in series; a plurality of drain terminals, each drain terminal of the plurality of drain terminals being respectively connected to a drain of a GaN transistor die of the plurality of GaN transistor dies; a series-switch-driver (SSD) connected to a gate of each GaN transistor die of the plurality of GaN transistor dies; exactly one gate terminal connected to the SSD; a source terminal connected to a first source of a first GaN transistor die of the plurality of GaN transistor dies; and a package encapsulating the plurality of GaN transistor dies and the SSD, and exposing the plurality of drain terminals, the one gate terminal, and the source terminal, the SSD being configured to control each gate of each GaN transistor based on the one gate terminal.

2. The multi-drain power module according to claim 1, the plurality of GaN transistor dies comprising the first GaN transistor die and a second GaN transistor die,
   a first drain of the first GaN transistor die being connected to a second source of the second GaN transistor,
   a first drain terminal of the plurality of drain terminals being connected to the first drain of the first GaN transistor die, and
   a second drain terminal of the plurality of drain terminals being connected to a second drain of the second GaN transistor die.

3. The multi-drain power module according to claim 2, the SSD comprising:
   a first gate input terminal connected to the gate terminal;
   a first driver connected between the first gate input terminal and a first gate intermediate terminal;
   a first FB connected between the first gate intermediate terminal and a first gate of the first GaN transistor die;
   a second gate input terminal coupled to the first gate input terminal;
   a second driver connected between the second gate input terminal and a first gate intermediate terminal;
   a second FB connected between the second gate intermediate terminal and a second gate of the second GaN transistor die;
   a first gate capacitor connected between the first gate input terminal and the second gate input terminal; and
   a second gate capacitor connected between the second gate intermediate terminal and the second drain of the second GaN transistor die.

4. The multi-drain power module according to claim 3, the SSD further comprising:
   a first Zener diode connected between the first gate intermediate terminal and the first source of the first GaN transistor die; and
   a second Zener diode connected between the second gate intermediate terminal and the second source of the second GaN transistor die.

5. The multi-drain power module according to claim 4, the first driver comprising:
   a first driver first diode connected between the first gate input terminal and the first gate intermediate terminal such that a diode forward current flows form the first gate input terminal to the first gate intermediate terminal; and
   a first driver second diode connected between the first gate input terminal and the first gate intermediate terminal such that the diode forward current flows form the first gate intermediate terminal to the first gate input terminal.

6. The multi-drain power module according to claim 4, the kth driver comprising:
   a kth driver first diode connected between the kth gate input terminal and the kth gate intermediate terminal such that a diode forward current flows form the kth gate input terminal to the kth gate intermediate terminal; and
   a kth driver second diode connected between the kth gate input terminal and the kth gate intermediate terminal such that the diode forward current flows form the kth gate intermediate terminal to the kth gate input terminal.

7. The multi-drain power module according to claim 1, the plurality of GaN transistor dies comprising the first GaN transistor die to Nth GaN transistor die,
   a first drain of the first GaN transistor die being connected to a second source of a second GaN transistor die,
   a first drain terminal of the plurality of drain terminals being connected to the first drain of the first GaN transistor die,
   an ith drain of ith GaN transistor die of the plurality of GaN transistor dies being connected to a (i+1)th source of a (i+1)th GaN transistor die,
   an ith drain terminal of the plurality of drain terminals being connected to the ith drain of the ith GaN transistor die,
   an Nth drain of an Nth GaN transistor die of the plurality of GaN transistor dies being connected to an Nth drain terminal of the plurality of drain terminals,
   i being from 2 to (N−1), and
   N being an integer greater than 2.

8. The multi-drain power module according to claim 7, the SSD comprising:
   a first gate input terminal connected to the gate terminal;
   a first driver connected between the first gate input terminal and a first gate intermediate terminal;
   a first FB connected between the first gate intermediate terminal and a first gate of the first GaN transistor die;
   a second gate input terminal coupled to the first gate input terminal;
   a second driver connected between the second gate input terminal and a first gate intermediate terminal;
   a second FB connected between the second gate intermediate terminal and a second gate of the second GaN transistor die;
   a kth gate input terminal coupled to a (k−1)th source of a (k−1)th GaN transistor die of the plurality of GaN transistor dies;
   a kth driver connected between the kth gate input terminal and a kth gate intermediate terminal; and
   a kth FB connected between the kth gate intermediate terminal and a kth gate of a kth GaN transistor die of the plurality of GaN transistor dies,
   k being from 3 to N.

9. The multi-drain power module according to claim 8, the SSD further comprising:
   a first gate capacitor connected between the first gate input terminal and the second gate input terminal; and
   an ith gate capacitor connected between a (i+1)th gate input terminal and an ith source of the ith GaN transistor die; and
   an Nth gate capacitor connected between an Nth gate intermediate terminal and Nth drain of an Nth GaN transistor die of the plurality of GaN transistor dies.

10. The multi-drain power module according to claim 9, the SSD further comprising:
    a first Zener diode connected between the first gate intermediate terminal and the first source of the first GaN transistor die;
    a second Zener diode connected between the second gate intermediate terminal and the second source of the second GaN transistor die; and
    a kth Zener diode connected between a kth gate intermediate terminal and a kth source of a kth GaN transistor die.

11. A bi-directional boost DC-DC converter, comprising:
    a first multi-drain power module and a second multi-drain power module, each of the first and second multi-drain power modules being the multi-drain power module according to claim 1;
    a first terminal connected to one of the plurality of drain terminals of the first multi-drain power module;

a first intermediate terminal connected to the source terminal of the first multi-drain power module and one of the plurality of drain terminals of the second multi-drain power module; and a first inductor connected between the first intermediate terminal and a second terminal.

12. The bi-directional boost DC-DC converter according to claim 11, further comprising a first capacitor connected between the first terminal and a third terminal, and a second capacitor connected between the second terminal and a fourth terminal, the third terminal being connected to the fourth terminal.

13. A single-phase voltage source inverter, comprising:
a first multi-drain power module, a second multi-drain power module, a third multi-drain power module, a fourth multi-drain power module, a fifth multi-drain power module, and a sixth multi-drain power module, each of the first to sixth multi-drain power modules being the multi-drain power module according to claim 1;
a first terminal connected to one of the plurality of drain terminals of the first multi-drain power module;
a first intermediate terminal connected to the source terminal of the first multi-drain power module and one of the plurality of drain terminals of the second multi-drain power module;
a first inductor connected between the first intermediate terminal and a second terminal;
a first power source connected between the first terminal and a third terminal;
a fourth terminal connected to the source terminal of the second multi-drain power module and the third terminal;
a fifth terminal connected to the second terminal and one of the plurality of drain terminals of the third multi-drain power module;
a second intermediate terminal connected to the source terminal of the third multi-drain power module and one of the plurality of drain terminals of the fourth multi-drain power module;
a second inductor connected between the second intermediate terminal and a sixth terminal;
a seventh terminal connected to the second terminal and one of the plurality of drain terminals of the fifth multi-drain power module;
a third intermediate terminal connected to the source terminal of the fifth multi-drain power module and one of the plurality of drain terminals of the sixth multi-drain power module;
a third inductor connected between the third intermediate terminal and an eighth terminal; and
a second power source connected between the sixth terminal and the eighth terminal.

14. The single-phase voltage source inverter according to claim 13, further comprising a first capacitor connected between the first terminal and a ninth terminal, a second capacitor connected between the second terminal and the fourth terminal, a third capacitor connected between the sixth terminal and a tenth terminal, and a fourth capacitor connected between the eighth terminal and the tenth terminal, the ninth terminal being connected to the source terminal of the fourth multi-drain power module and the source terminal of the sixth multi-drain power module.

15. A multi-drain power module, comprising: a first gallium-nitride (GaN) transistor die including a first source, a first gate, and a first drain; a second GaN transistor die including a second source, a second gate, and a second drain, the second source being connected to the first drain; a first ferrite bead (FB) connected between a first gate intermediate terminal and the first gate; a first driver connected between a first gate input terminal and the first gate intermediate terminal; a second FB connected between a second gate intermediate terminal and the second gate; a second driver connected between a second gate input terminal and the second gate intermediate terminal; exactly one gate terminal connected to the first gate input terminal; a source terminal connected to the first source; a first drain terminal connected to the first drain; a second drain terminal connected to the second drain; and a package encapsulating the first and second GaN transistor dies, and exposing the first and second drain terminals, the one gate terminal, and the source terminal, the first gate and the second gate being configured to be electrically coupled with the one gate terminal.

16. The multi-drain power module according to claim 15, further comprising:
a first gate capacitor connected between the first gate input terminal and the second gate input terminal; and
a second gate capacitor connected between the second gate intermediate terminal and the second drain.

17. The multi-drain power module according to claim 16, further comprising:
a first Zener diode connected between the first gate intermediate terminal and the first source; and
a second Zener diode connected between the second gate intermediate terminal and the second source.

18. The multi-drain power module according to claim 17, the first driver comprising:
a first driver first diode connected between the first gate input terminal and the first gate intermediate terminal such that a diode forward current flows form the first gate input terminal to the first gate intermediate terminal; and
a first driver second diode connected between the first gate input terminal and the first gate intermediate terminal such that the diode forward current flows form the first gate intermediate terminal to the first gate input terminal.

19. The multi-drain power module according to claim 18, the first driver comprising:
an on resistor connected between the first driver first diose between the first gate intermediate terminal; and
an off resistor connected between the first driver second diode between the first gate intermediate terminal.

20. A multi-drain power module, comprising:
a plurality of gallium-nitride (GaN) transistor dies including a first GaN transistor die and a second GaN transistor die to an ith GaN transistor die, the first GaN transistor die including a first source, a first gate, and a first drain, the second GaN transistor die including a second source, a second gate, and a second drain, and the ith GaN transistor die including an ith source, an ith gate, and an ith drain, i being from 3 to N, and N being an integer greater than 2;
a first FB connected between a first gate intermediate terminal and the first gate;
a first driver connected between a first gate input terminal and the first gate intermediate terminal;
a second FB connected between a second gate intermediate terminal and the second gate;
a second driver connected between a second gate input terminal and the second gate intermediate terminal;
an ith FB connected between a ith gate intermediate terminal and the ith gate;

an ith driver connected between an ith gate input terminal and the ith gate intermediate terminal;
a gate terminal connected to the first gate input terminal;
a source terminal connected to the first source;
a first drain terminal connected to the first drain;
a second drain terminal connected to the second drain;
an ith drain terminal connected to the ith drain;
a first gate capacitor connected between the first gate input terminal and the second gate input terminal; an (i−1)th gate capacitor connected between the ith gate intermediate terminal and the (i−1)th source;
an Nth gate capacitor connected between the Nth gate intermediate terminal and the Nth drain; and
a package encapsulating the plurality of GaN transistor dies, and exposing the first and second to Nth drain terminals, the gate terminal, and the source terminal.

* * * * *